United States Patent
MacManus

(10) Patent No.: US 9,917,608 B2
(45) Date of Patent: Mar. 13, 2018

(54) EQUIPMENT INTERCONNECTION

(71) Applicant: AltioStar Networks, Inc., Tewksbury, MA (US)

(72) Inventor: Gerard MacManus, Tewsbury, MA (US)

(73) Assignee: ALTIOSTAR NETWORKS, INC., Tewsbury, MA (US)

(*) Notice: Subject to any disclaimer, the term of this patent is extended or adjusted under 35 U.S.C. 154(b) by 0 days.

(21) Appl. No.: 15/222,373

(22) Filed: Jul. 28, 2016

(65) Prior Publication Data
US 2017/0041034 A1 Feb. 9, 2017

Related U.S. Application Data

(60) Provisional application No. 62/201,695, filed on Aug. 6, 2015.

(51) Int. Cl.
*H04B 1/38* (2015.01)
*H05K 5/00* (2006.01)

(52) U.S. Cl.
CPC ............. *H04B 1/38* (2013.01); *H05K 5/0026* (2013.01)

(58) Field of Classification Search
CPC ....................................................... H04B 1/38
See application file for complete search history.

(56) References Cited

U.S. PATENT DOCUMENTS

| 5,521,793 A * | 5/1996 | Dalgleish | H04B 1/38 220/315 |
| 2015/0148111 A1* | 5/2015 | Kim | H04Q 1/025 455/575.8 |
| 2016/0043509 A1* | 2/2016 | Reeves | H01R 13/631 439/374 |

* cited by examiner

*Primary Examiner* — Hsin-Chun Liao
(74) *Attorney, Agent, or Firm* — Mintz Levin Cohn Ferris Glovsky and Popeo, P.C.

(57) ABSTRACT

A radio equipment and a method for interconnecting components in the radio equipment are disclosed. The radio equipment includes a signal processing module and a radio component positioned relative to each other for a high-speed connection using at least a first mechanical connector and a high-speed connector. The first mechanical connector includes a first part disposed on the radio component and a second part disposed on the signal processing module. The high-speed connector includes a first part disposed on the radio component and a second part disposed on the signal processing module. At least one high-speed processing capability is provided to the radio equipment using the signal processing module through the high-speed connector. The signal processing module and the radio equipment are interchangeably connected.

8 Claims, 19 Drawing Sheets

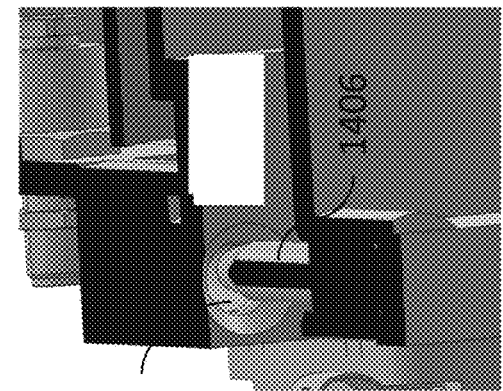
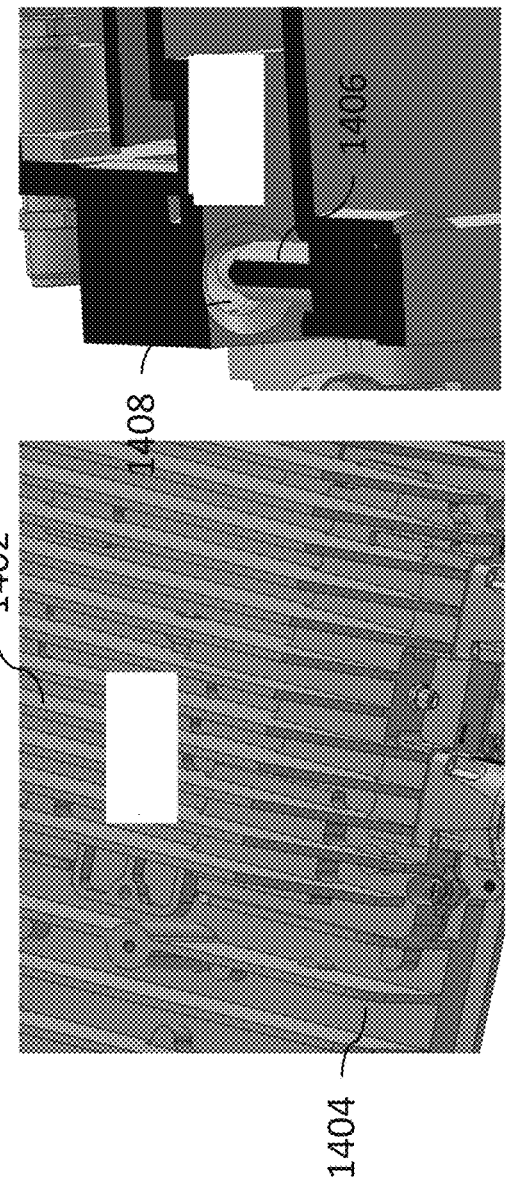
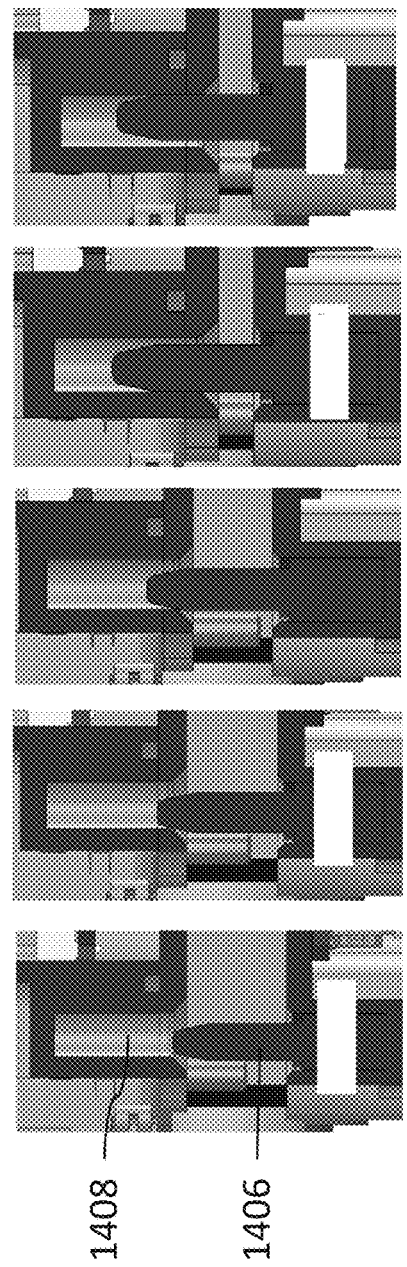

EQUIPMENT INTERCONNECTION

CROSS-REFERENCE TO RELATED APPLICATIONS

The present application claims priority to U.S. Provisional Patent Application No. 62/201,695, to MacManus, filed Aug. 6, 2015, and entitled "Equipment Interconnection", and incorporates its disclosure herein by reference in its entirety.

TECHNICAL FIELD

In some implementations, the current subject matter described herein generally relates to interconnection in radio equipment in a communications system, such as in Long Term Evolution (LTE) wireless communications systems.

BACKGROUND

Modern wireless networks provide communications capabilities to a variety of devices, such as cellular telephones, computers, smartphones, tablets, etc. A wireless network is typically distributed over land areas, which are called cells. Each such cell is served by at least one fixed-location transceiver, which is referred to as a cell site or a base station. Each cell can use a different set of frequencies than its neighbor cells in order to avoid interference and provide guaranteed bandwidth within each cell. When cells are joined together, they provide radio coverage over a wide geographic area, which enables a large number of mobile telephones, and/or other wireless devices or portable transceivers to communicate with each other and with fixed transceivers and telephones anywhere in the network.

The base stations are typically coupled to or otherwise include a radio equipment, such as an antenna that can receive and/or transmit wireless signals to wireless devices and/or to other base stations. The radio equipment is typically located above ground at a predetermined height and is positioned in a certain fashion to ensure adequate radio coverage as well as receipt/transmission of signals. Installation of such radio equipment in macro cells (providing radio coverage to large areas) can typically be performed without regard to a particular orientation.

There is a need to provide for an ability to interconnect various pieces of radio equipment within a communications system that can require multiple high speed interconnections for signaling and power purposes.

SUMMARY

In some implementations, the current subject matter relates to a method for interconnecting components in a radio equipment. The method can include a positioning a signal processing module with respect to a radio component of a radio equipment, aligning, using at least one first mechanical connection, comprising a first part and a second part, the first part of the first mechanical connection being disposed on the radio component and the second part of the first mechanical connection being disposed on the signal processing module, the radio component and the signal processing module for a high-speed connection, connecting, using a high-speed connection, comprising a first part and a second part, the first part of the high-speed connection being disposed on the radio component and the second part of the high-speed connection being disposed on the signal processing module, the radio component and the signal processing module using the high-speed connection, and providing high-speed processing capabilities to the radio equipment using the signal processing module, the signal processing module being interchangeably connected to the radio equipment.

In some implementations, the current subject matter can include one or more of the following optional features. In some implementations, the radio equipment can include at least one of the following: an evolved node (eNodeB) base station, a baseband unit, a remote radio head, a base station, a micro base station, a macro base station, an omni-directional base station, a directional base station, and any combination thereof.

In some implementations, the aligning can include guiding the radio component for a mechanical connection with the signal processing module. The guiding can be performed using at least one guiding connector having a first part and a second part. The first part of the guiding connector can be disposed on the radio component and the second part of the guiding connector can be disposed on the signal processing module. The guiding connector can prevent misalignment of the radio component and the signal processing module.

In some implementations, the first part of the first mechanical connector can be a female part and the second part of the first mechanical connector can be a male part. The first and second parts can be configured to mate to form a mechanical connection prior to establishing the high-speed connection.

In some implementations, the connecting can include providing, by the at least one high-speed connector, a sealed high-speed connection between the radio component and the signal processing module. The sealed high-speed connection can be formed subsequent to the mechanical connections formed by the guiding connector and the first mechanical connector.

In some implementations, the sealed high-speed connection can be formed using at least one seal. The seal can include at least one of the following: a radio-environmental seal, a radio frequency seal, and any combination thereof.

In some implementations, the guiding connector and the first mechanical connector can control alignment of the radio component with respect to the signal processing module during connection of the radio component and the signal processing module.

Articles are also described that comprise a tangibly embodied machine-readable medium embodying instructions that, when performed, cause one or more machines (e.g., computers, etc.) to result in operations described herein. Similarly, computer systems are also described that can include a processor and a memory coupled to the processor. The memory can include one or more programs that cause the processor to perform one or more of the operations described herein. Additionally, computer systems may include additional specialized processing units that are able to apply a single instruction to multiple data points in parallel.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWING

The accompanying drawings, which are incorporated in and constitute a part of this specification, show certain aspects of the subject matter disclosed herein and, together with the description, help explain some of the principles associated with the disclosed implementations. In the drawings.

FIGS. 13a-b, 14a-c, 15a-b, and 16 illustrate components of an exemplary signal processing module, according to some implementations of the current subject matter;

DETAILED DESCRIPTION

In some implementations, the current subject matter can be implemented in a wireless communication system, such as a Long Term Evolution system, where some of its components are discussed below.

Figure 1:
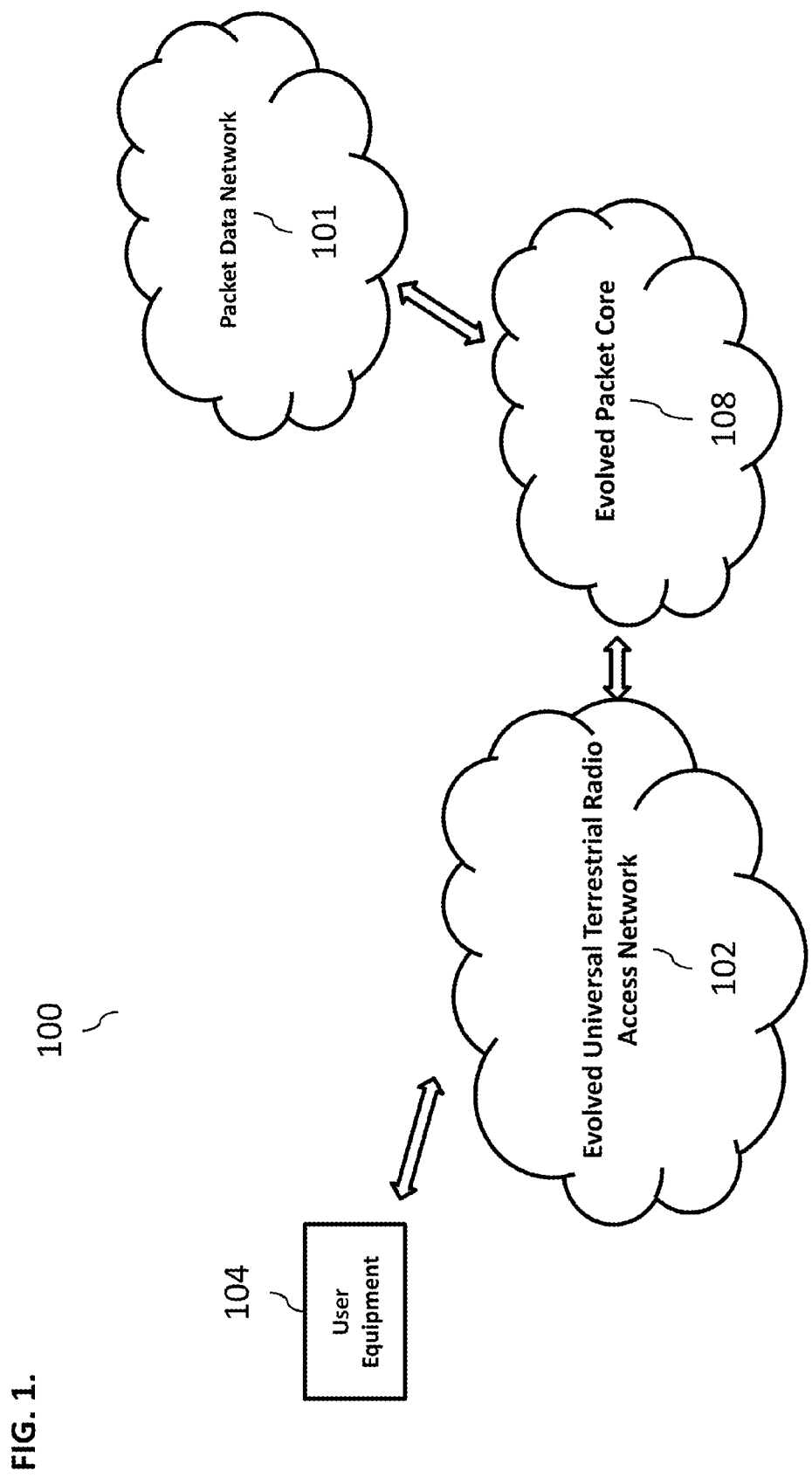
FIG. 1 illustrates an exemplary conventional Long Term Evolution ("LTE") communications system.
Figure 2:
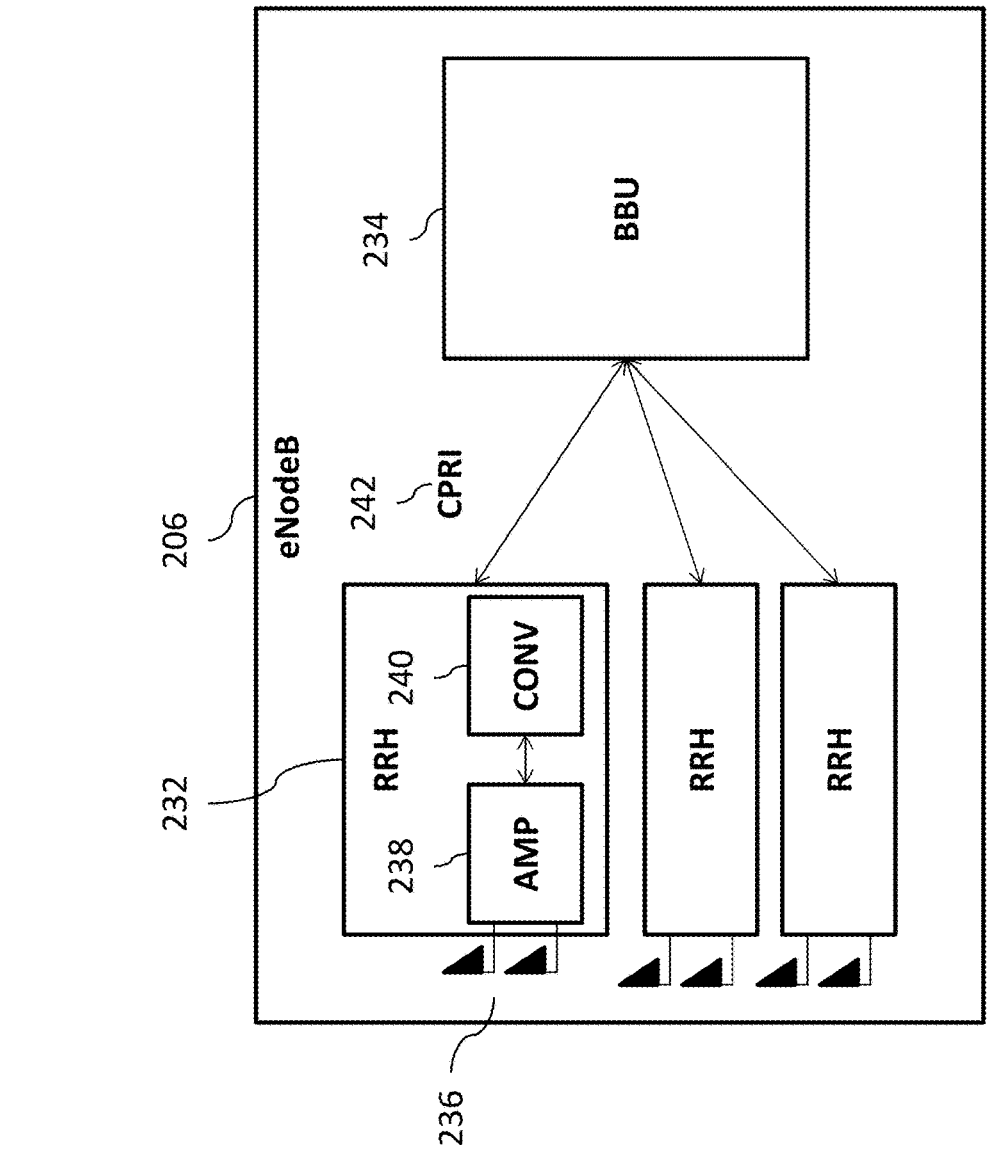
FIG. 2 illustrates an exemplary evolved Node B of the exemplary LTE system shown in FIG. 1.

FIGS. 1 and 2 illustrate an exemplary conventional Long Term Evolution ("LTE") communication system 100 along with its various components. An LTE system or a 4G LTE, as it commercially known, is governed by a standard for wireless communication of high-speed data for mobile telephones and data terminals. The standard is based on the GSM/EDGE ("Global System for Mobile Communications"/"Enhanced Data rates for GSM Evolution") as well as UMTS/HSPA ("Universal Mobile Telecommunications System"/"High Speed Packet Access") network technologies. The standard is developed by the 3GPP ("3rd Generation Partnership Project").

As shown in FIG. 1, the system 100 can include an evolved universal terrestrial radio access network ("EUTRAN") 102, an evolved packet core ("EPC") 108, and a packet data network ("PDN") 101, where the EUTRAN 102 and EPC 108 provide communication between a user equipment 104 and the PDN 101. The EUTRAN 102 can include a plurality of evolved node B's ("eNodeB" or "ENODEB" or "enodeb" or "eNB") or base stations 206 (as shown in FIG. 2) that provide communication capabilities to a plurality of user equipment 104. The user equipment 104 can be a mobile telephone, a smartphone, a tablet, a personal computer, a personal digital assistant ("PDA"), a server, a data terminal, and/or any other type of user equipment, and/or any combination thereof. The user equipment 104 can connect to the EPC 108 and eventually, the PDN 101, via any eNodeB 206. Typically, the user equipment 104 can connect to the nearest, in terms of distance, eNodeB 206. In the LTE system 100, the EUTRAN 102 and EPC 108 work together to provide connectivity, mobility and services for the user equipment 104.

As stated above, the EUTRAN 102 includes a plurality of eNodeBs 206, also known as cell sites. The eNodeBs 206 provide radio functions and perform key control functions including scheduling of air link resources or radio resource management, active mode mobility or handover, and admission control for services. The eNodeBs 206 are responsible for selecting which mobility management entities will serve the user equipment 104 and for protocol features like header compression and encryption. The eNodeBs 206 that make up an EUTRAN 102 collaborate with one another for radio resource management and handover.

FIG. 2 illustrates an exemplary structure of eNodeB 206. The eNodeB 206 can include at least one remote radio head ("RRH") 232 (typically, there can be three RRH 232 at a cell site) and a baseband unit ("BBU") 234. The RRH 232 can be connected to antennas 236. The RRH 232 and the BBU 234 can be connected using an optical interface that is compliant with common public radio interface ("CPRI") 242 standards specification. The operation of the eNodeB 206 can be characterized using the following exemplary, non-limiting standard parameters (and specifications): radio frequency band (3GPP Band 4, Band 9, Band 17, and/or others), channel bandwidth (1.4, 3, 5, 10, 15, 20 MHz), access scheme (downlink: OFDMA; uplink: SC-OFDMA), antenna technology (downlink: 2×2, 4×2, 4×4 MIMO; uplink: 1×2 single input multiple output ("SIMO") or any other modes), number of sectors (e.g., 3 or more), maximum transmission power (e.g., 60 W, which can also be more or less), maximum transmission rate (e.g., downlink: 150 Mb/s; uplink: 50 Mb/s, and/or any other values), S1/X2 interface (1000Base-SX, 1000Base-T), and mobile environment (up to 350 km/h). The BBU 234 can be responsible for digital baseband signal processing, termination of S1 line, termination of X2 line, call processing and monitoring control processing. IP packets that are received from the EPC 108 (not shown in FIG. 2) can be modulated into digital baseband signals and transmitted to the RRH 232. Conversely, the digital baseband signals received from the RRH 232 can be demodulated into IP packets for transmission to EPC 108.

The RRH 232 can transmit and receive wireless signals using antennas 236. The RRH 232 can convert (using converter ("CONV") 240) digital baseband signals from the BBU 234 into radio frequency ("RF") signals and power amplify (using amplifier ("AMP") 238) them for transmission to user equipment 104 (not shown in FIG. 2). Conversely, the RF signals that are received from user equipment 104 are amplified (using AMP 238) and converted (using CONV 240) to digital baseband signals for transmission to the BBU 234.

Figure 3:
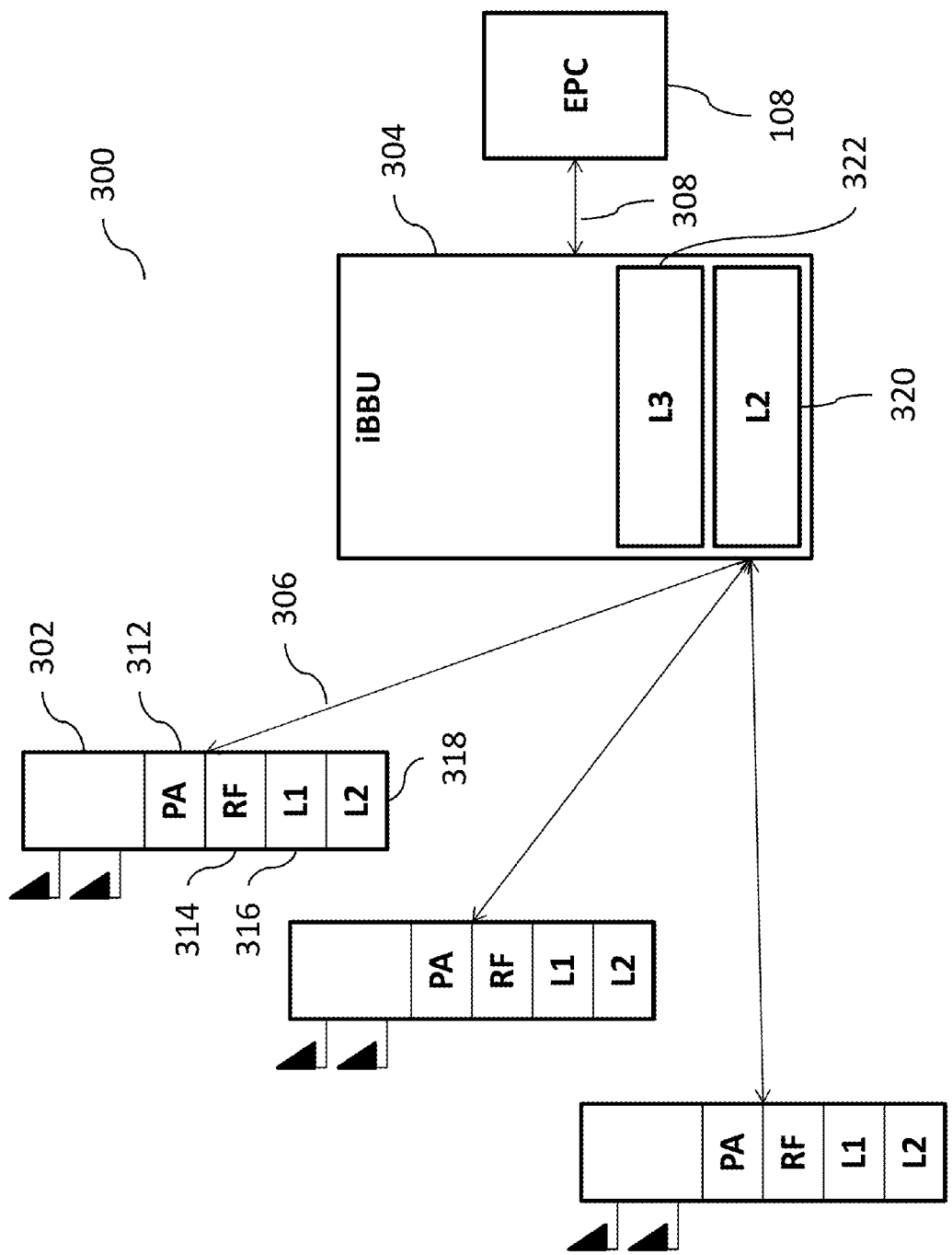
FIG. 3 illustrates an exemplary intelligent Long Term Evolution Radio Access Network, according to some implementations of the current subject matter.

FIG. 3 illustrates an exemplary system 300, according to some implementations of the current subject matter. The system 300 can be implemented as a centralized cloud radio access network ("C-RAN"). The system 300 can include at least one intelligent remote radio head ("iRRH") unit 302 and an intelligent baseband unit ("iBBU) 304. The iRRH 302 and iBBU 304 can be connected using Ethernet fronthaul ("FH") communication 306 and the iBBU 304 can be connected to the EPC 108 using backhaul ("BH") communication 308. The user equipment 104 (not shown in FIG. 3) can communicate with the iRRH 302.

In some implementations, the iRRH 302 can include the power amplifier ("PA") module 312, the radio frequency ("RF") module 314, LTE layer L1 (or PHY layer) 316, and a portion 318 of the LTE layer L2. The portion 318 of the LTE layer L2 can include the media access control ("MAC") layer and can further include some functionalities/protocols associated with radio link control ("RLC") and packet data convergence protocol ("PDCP"). The iBBU 304 can be a centralized unit that can communicate with a plurality of iRRH and can include LTE layer L3 322 (e.g., radio resource control ("RRC"), radio resource management ("RRM"), etc.) and can also include a portion 320 of the LTE layer L2. Similar to portion 318, the portion 320 can include various functionalities/protocols associated with RLC and PDCP. Thus, the system 300 can be configured to split functionalities/protocols associated with RLC and PDCP between iRRH 302 and the iBBU 304.

Figure 4C:
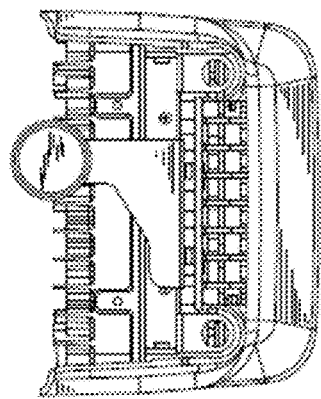
FIGS. 4a-d illustrate an exemplary directional micro base station, according to some implementations of the current subject matter.
Figure 4D:
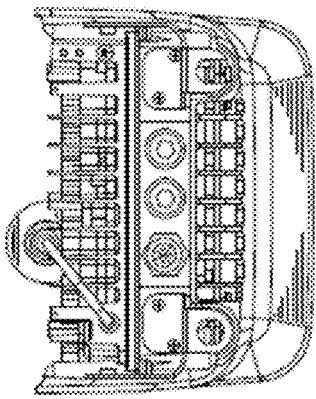
Figure 4B:
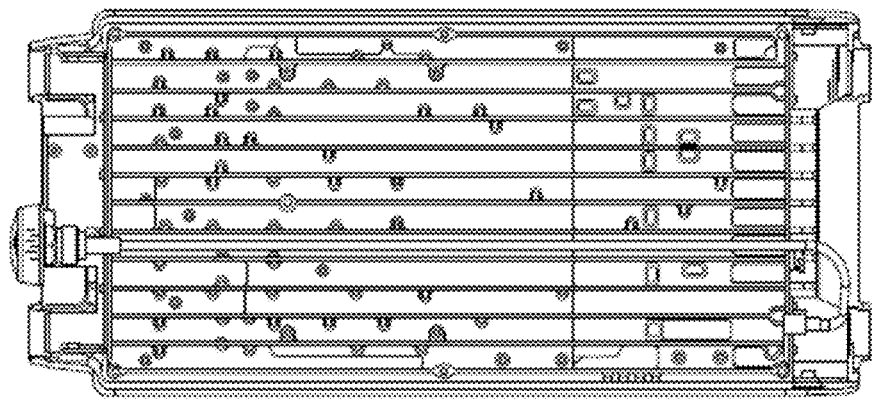
Figure 4A:
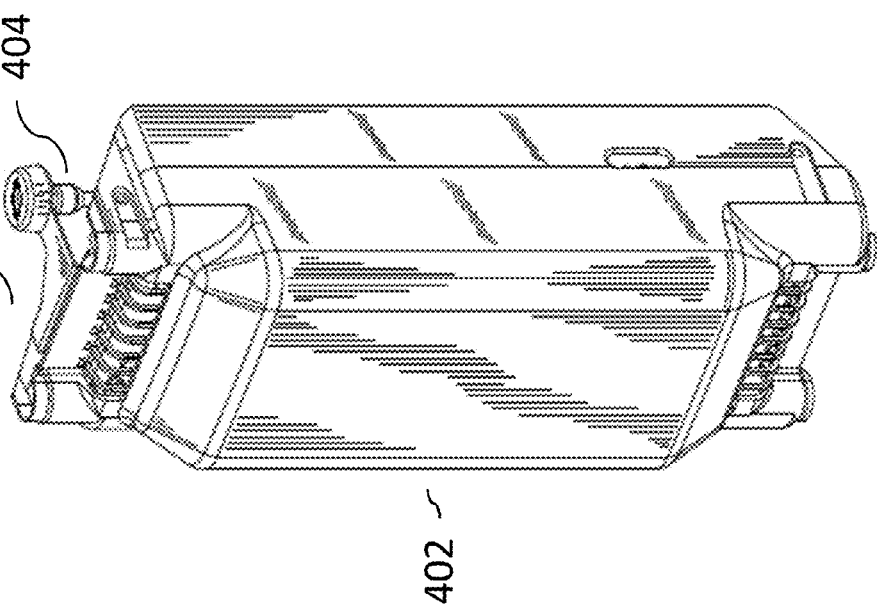

FIGS. 4a-d illustrate an exemplary radio equipment 400, a directional micro base station, according to some implementations of the current subject matter. FIG. 4a illustrates a front perspective view of the micro base station 400; FIG. 4b illustrates a back view of the micro base station 400; FIG. 4c illustrates a top view of the micro base station 400; and FIG. 4d illustrates a bottom view of the micro base station 400. The directional micro base station 400 can operate in the communications systems shown in FIGS. 1-3 and can be part of a remote radio head, a baseband unit, and/or a combination of both. The micro base station 400 can be used to transmit/receive signals in/from a particular direction.

Figure 6:
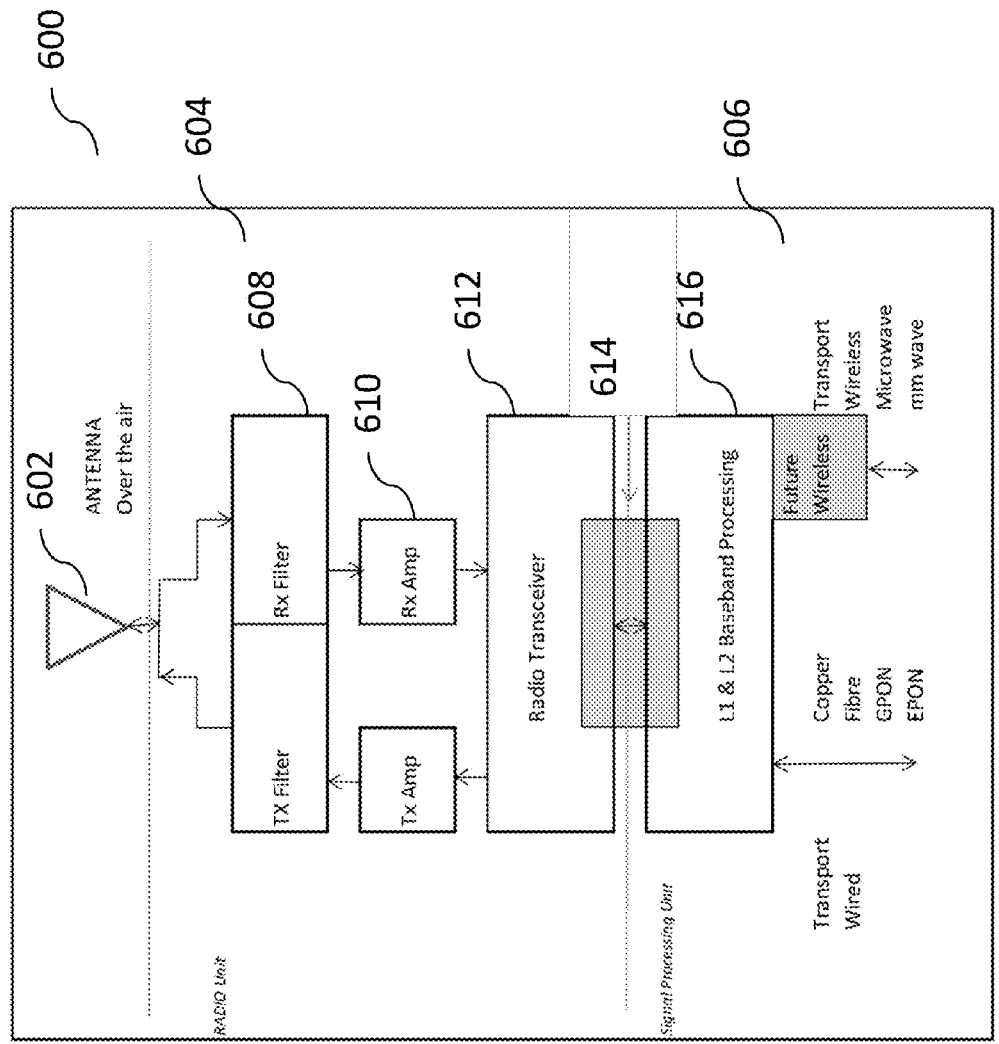
FIG. 6 illustrates an exemplary structure of a base station, according to some implementations of the current subject matter.
Figure 7A:
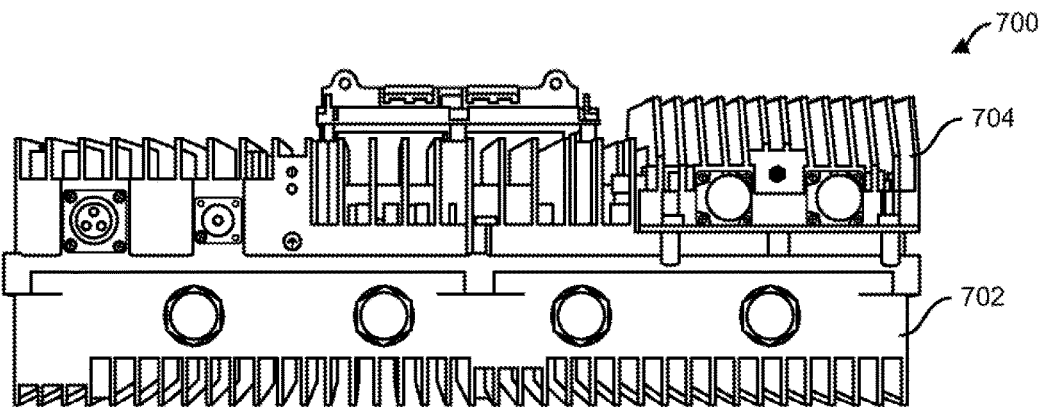
FIGS. 7a-d illustrate an exemplary signal processing module for connecting a base station, according to some implementations of the current subject matter.
Figure 7B:
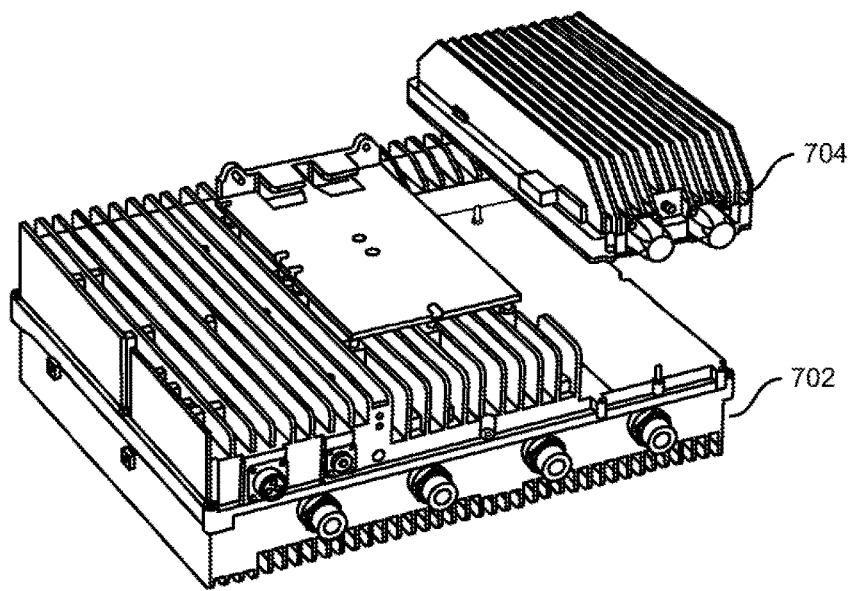
Figure 7C:
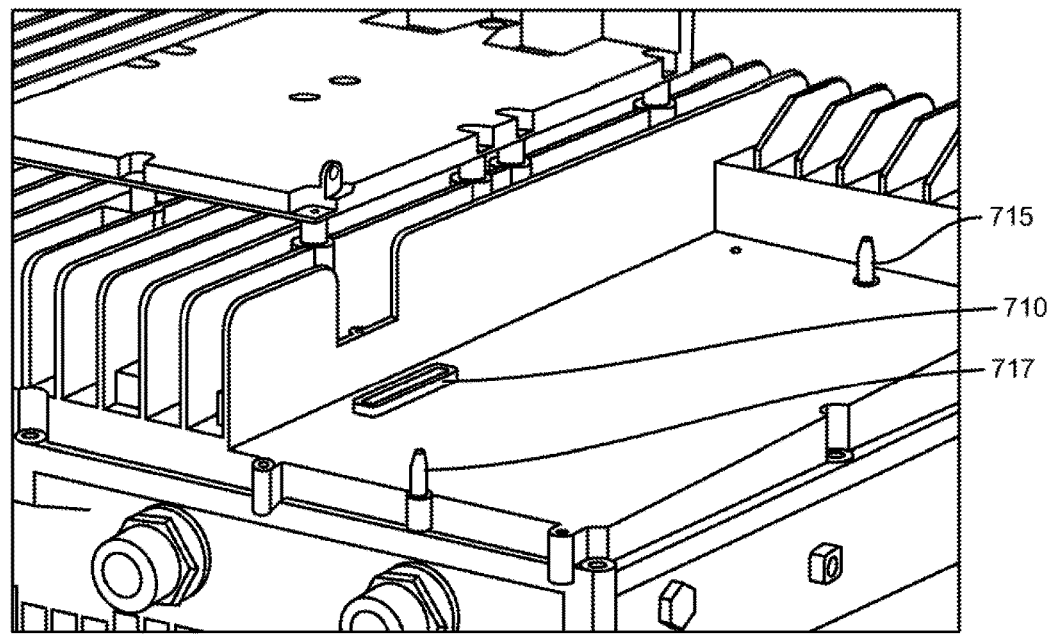
Figure 7D:
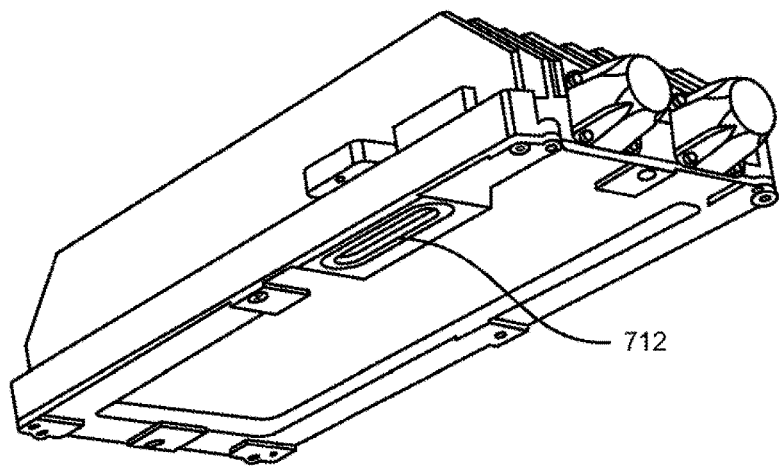

The micro base station 400 can include a housing 402 which can contain various electronic components of the micro base station 400, including but not limited to, antenna circuitry, transmitter/receiver circuitry, filter(s), amplifier(s), signal processing circuitry, and/or any other circuitry and/or components. Exemplary components of the base station 400 are illustrated in FIG. 6. The base station 400 can also include an antenna housing 404 that can house various antenna components.

Figure 5C:
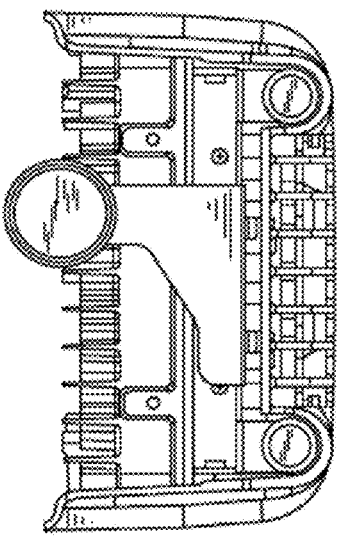
FIGS. 5a-d illustrate an exemplary omni-directional micro base station, according to some implementations of the current subject matter.
Figure 5D:
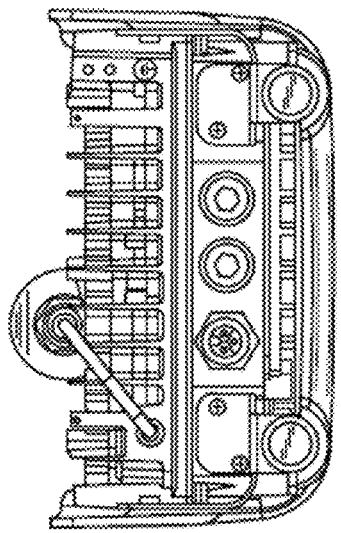
Figure 5B:
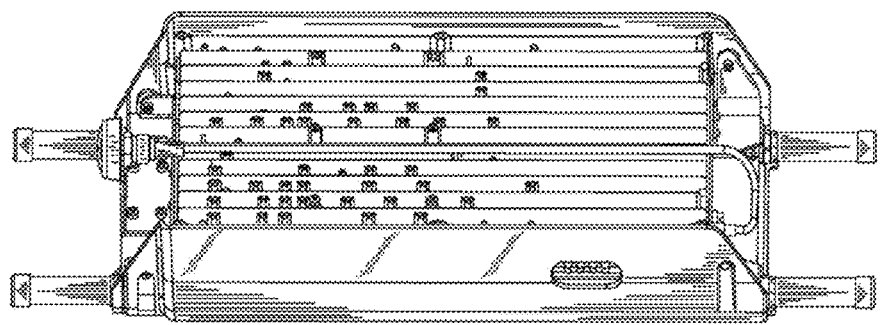
Figure 5A:
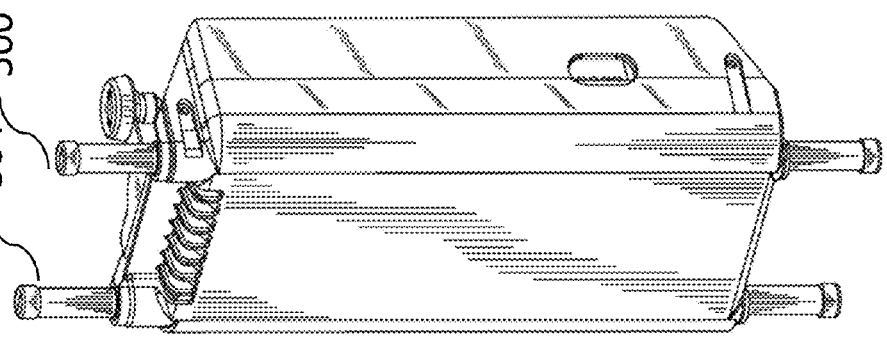

FIGS. 5a-d illustrate an exemplary radio equipment 500, a omni-directional micro base station, according to some implementations of the current subject matter. FIG. 5a illustrates a front perspective view of the micro base station 500; FIG. 5b illustrates a back view of the micro base station 500; FIG. 5c illustrates a top view of the micro base station 500; and FIG. 5d illustrates a bottom view of the micro base station 500. The omni-directional micro base station 500 can operate in the communications systems shown in FIGS. 1-3 and can be part of a remote radio head, a baseband unit, and/or a combination of both. The micro base station 500 can be used to transmit/receive signals in/from any direction.

The omni-directional micro base station 500 can include a housing 502 which can contain various electronic components of the micro base station 500, including but not limited to, antenna circuitry, transmitter/receiver circuitry, filter(s), amplifier(s), signal processing circuitry, and/or any other circuitry and/or components. Exemplary components of the base station 500 are illustrated in FIG. 6. The base station 500 can also include an antenna housings 504 that can house various antenna components.

In some implementations, the micro base stations 400 and 500 can include high-speed interconnect components for interconnecting various modules as discussed below. Such components can be integrated into the base stations 400 and/or 500 and/or can be connectable with the base stations using high-speed interconnect connectors. The interconnect components can provide signal processing capabilities, power capabilities, signal transmission/receive capabilities, and/or any other capabilities. The interconnect components can provide scalability to the base stations.

In some implementations, the interconnect components can be used for interconnecting modules within a macro base station. For illustrative and non-limiting purposes only, the following discussion is presented with regard to the macro-base station. In some implementations, a radio equipment, such as a remote radio head for a macro base station unit, can include a signal processing module and/or any other module that can be connected for the purposes of providing signal processing capability, power capability, and/or any other capability (e.g., the module can be added as part of an upgrade, replacement, installation, etc.). The signal processing module can be connected to the radio equipment using high speed connectors and can make blind mate ingress protected (e.g., to dust, water submergence (known as IP67)) as well as RF-shield the interconnection between the signal processing module and the radio equipment. In some implementations, signals can be transmitted between the signal processing module and the radio equipment using common public radio interface ("CPRI"), Open Base Station Architecture Initiative ("OBSAI") and/or open radio equipment interface ("ORI") protocols, which can require multiple signal connections to achieve delivery.

FIG. 6 illustrates an exemplary structure a base station 600, according to some implementations of the current subject matter. The base station 600 can be a micro base station, a macro base station, and/or any other type of base station and/or radio equipment. For illustrative and non-limiting purposes, base station 600 is a macro base station. The base station 600 can include an antenna (e.g., an over-the-air antenna) 602, which can be communicatively coupled to a radio unit 604, where the radio unit 604 can be communicatively coupled to a signal processing unit or module 606. The radio unit 604 and the signal processing module 606 can be communicatively coupled using a connection 614 (discussed below in more detail). The connection 614 can allow engagement and disengagement of the radio unit 604 from the signal processing module 606 as well as allow for high-speed transmission of signals and/or power and/or any other types of signals.

In some implementations, the radio unit can include filters 608, such as a transmitting (Tx) filter and a receiving (Rx) filter. The respective filters 608 can be communicatively coupled to respective amplification units 610 (such as transmitting amplifier (Tx Amp) and receiving amplifier (Rx Amp), respectively). A radio transceiver 610 can be communicatively coupled to the amplification units 610. The radio transceiver can include a first connection part of the connection 614 that can be configured to mate with a second part of the connection 614 disposed on the signal processing module 606.

The signal processing module 606 can include layers L1 and L2 baseband processing unit(s) 616. The baseband processing unit(s) 616 can include the second part of the connection 614. The baseband processing unit(s) 616 can be coupled to various other components and/or connections, such as transport wired (e.g., copper, fiber, gigabit-capable passive optical networks ("GPON"), Ethernet passive optical network ("EPON"), etc. connections) and/or transport wireless connections (e.g., microwave, mm wave, etc. connections). The base station 600 can include other components that are not shown in FIG. 6 but that can be configured to perform one or more functionalities discussed above with regard to FIGS. 1-3.

FIGS. 7a-d illustrate an exemplary radio equipment 700, according to some implementations of the current subject matter. The radio equipment 700 can be a base station, an eNodeB, a baseband unit, a remote radio head, an intelligent baseband unit, an intelligent remote radio head (e.g., as shown and discussed above with regard to FIGS. 1-5d) and/or any other type of radio equipment. The radio equipment 700 can include a radio unit 702 communicatively coupled a signal processing module 704.

In some implementations, the radio unit 702 can be coupled to the signal processing module 704 using high-speed connectors 710 (disposed on the radio unit 702) and 712 (disposed on the signal processing module 704) as well as pin-type connectors 715 and 717 (disposed on the radio unit 702). The connectors 710 and 712 can be multi-pin type connectors that can be configured to mate with one another upon connection of the unit 702 and module 704. The connectors 710 and 712 can provide for high-speed connectivity, transmission of signals, power signals, and/or any other type of signals. The pins 715 and 717 can be mechanical type connectors. For example, the pins 715, 717 can be male connectors having corresponding receiving female connectors on the module 704.

In some implementations, to connect the signal processing module 704 and the radio unit 702, the corresponding connectors 710 and 712 as well as pins 715, 717 (and their corresponding female connectors) can be aligned, and then, the unit 702 and module 704 can be pressed against one another for connection. In some implementation, the signal processing module 704 can allow for the radio unit 702 to be connected into various networks using different front-haul mechanisms, such as fiber optic, Ethernet, and/or any other type of connection. In some implementations, the module 704 can be external to the unit 702 and/or can be incorporated into the unit 704. Additionally, because module 704 can have radio frequency ("RF") capability, signal, power, baseband, etc., processing capability, the unit 702 can be easily upgraded and/or configured in accordance with various parameters that may be required for operating in a communications network (such as the one shown and discussed above in connection with FIGS. 1-3). In some implementations, to ensure that the signal processing module 704 connects to the radio unit 702 properly and without connector damage, the pins 715, 717 and/or any other physical constraints can be used to control placement and/or connection of unit 702 and module 704.

Figure 8A:
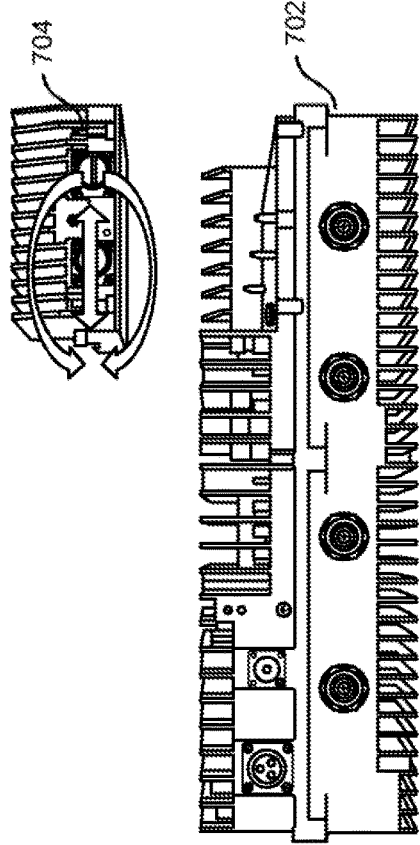
FIGS. 8a-c illustrate an exemplary high-speed connector for connecting components of a base station, according to some implementations of the current subject matter.
Figure 8B:
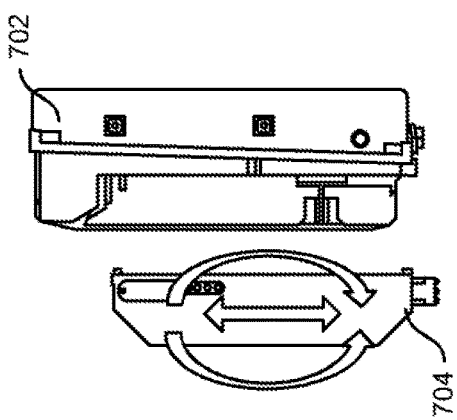
Figure 8C:
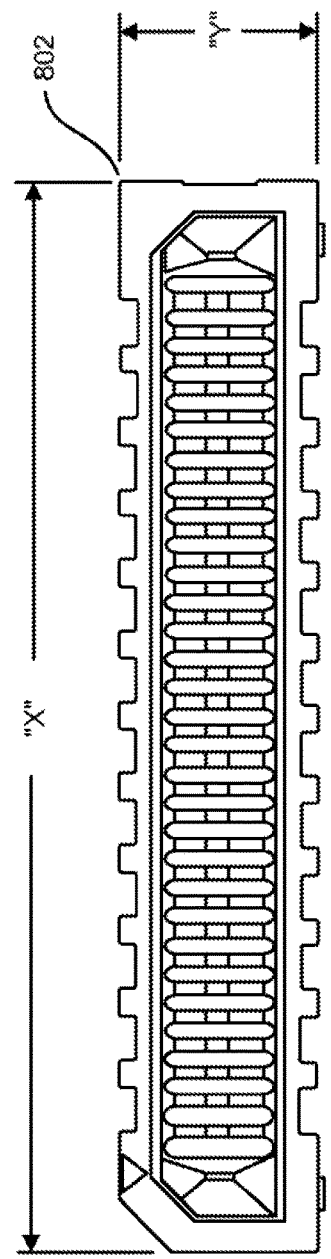

FIGS. 8a-c illustrate an exemplary connector 802 for connecting the radio unit 702 and the signal processing module 704, according to some implementations of the current subject matter. The arrows in FIGS. 8a-c can be indicative of the geometries/pins/tabs (of the radio unit 702 and/or the signal processing module 704) through the process of attaching the radio unit 702 and the signal processing module 704 and can be used to align the module 704 with unit 702. Thus, when installation of the module 704 to the unit 702 occurs (either factory-configured and/or field fitted), angles and/or positions of either the module 704 and/or the unit 702 are not the important factors during installation as tabs/pins/connectors can be used to for proper installation. The connector 802 shown in FIG. 8c is similar to the connector 712 on the signal processing module 704 shown in FIGS. 7a-d. The connector 802 along with other mechanical connectors (e.g., as shown in FIGS. 7a-d) can provide for a rigid mechanical connection between the signal processing module 704 and the radio unit 702. For example, the connector 802 can substantially prevent misalignment (e.g., zero-degree misalignment) of the module 704 in x- and/or y-directions. In some exemplary implementations, such misalignment can be limited not to exceed approximately 0.15 millimeters. As can be understood, the exemplary misalignment is not limited to the one discussed above.

Figure 9:
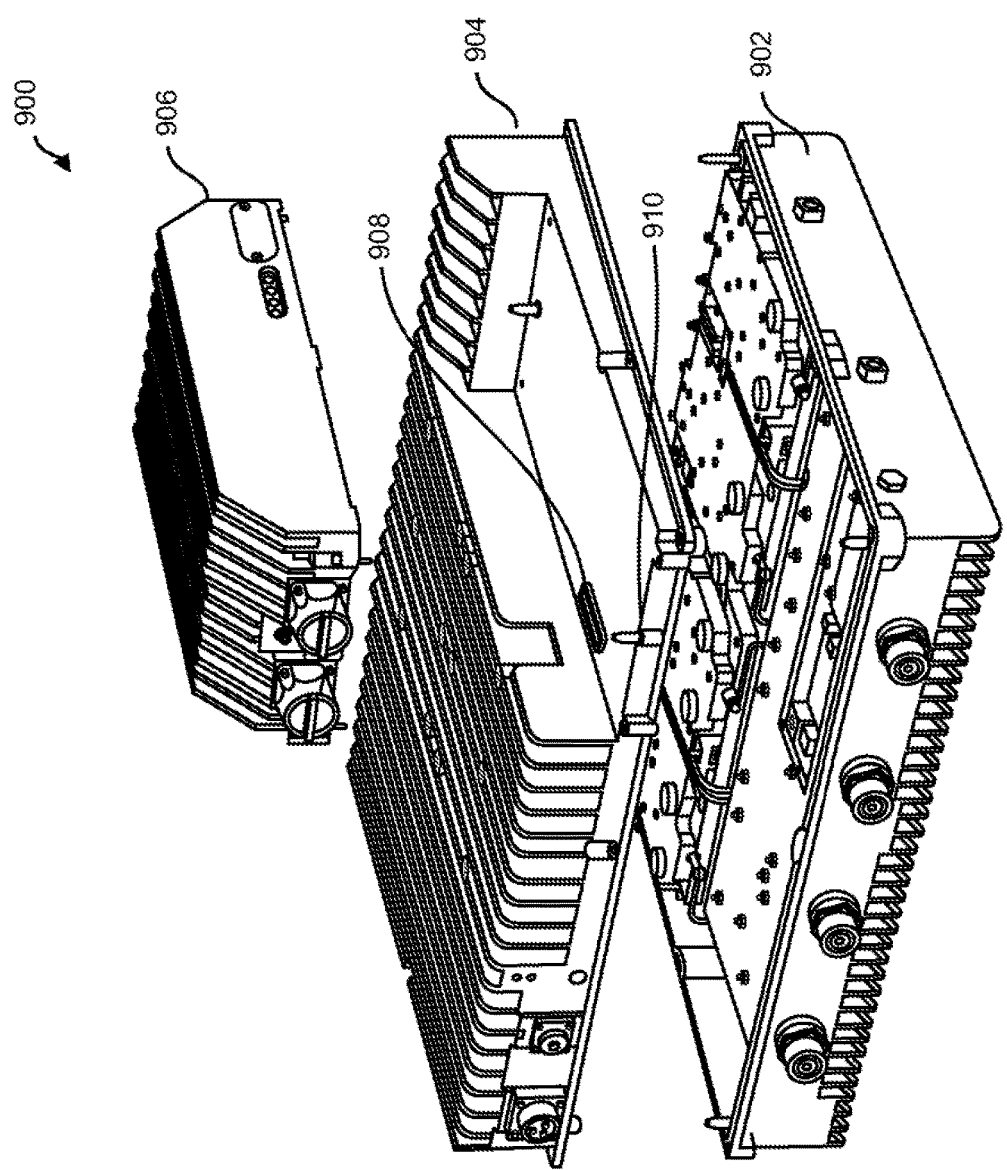
FIG. 9 illustrates exemplary modules of base station, according to some implementations of the current subject matter.
Figure 10A:
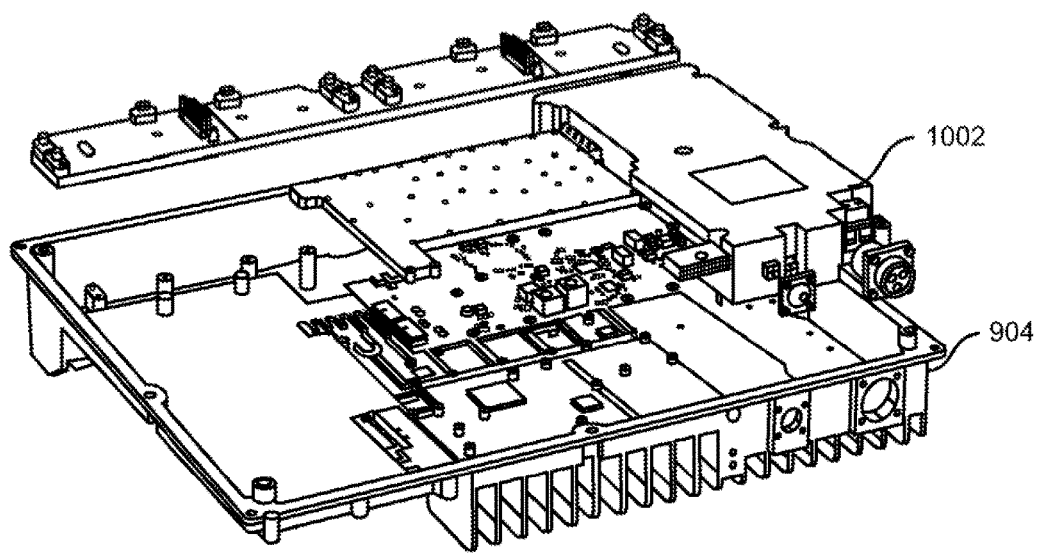
FIGS. 10a-b illustrate exemplary radio boards of a base station, according to some implementations of the current subject matter.
Figure 10B:
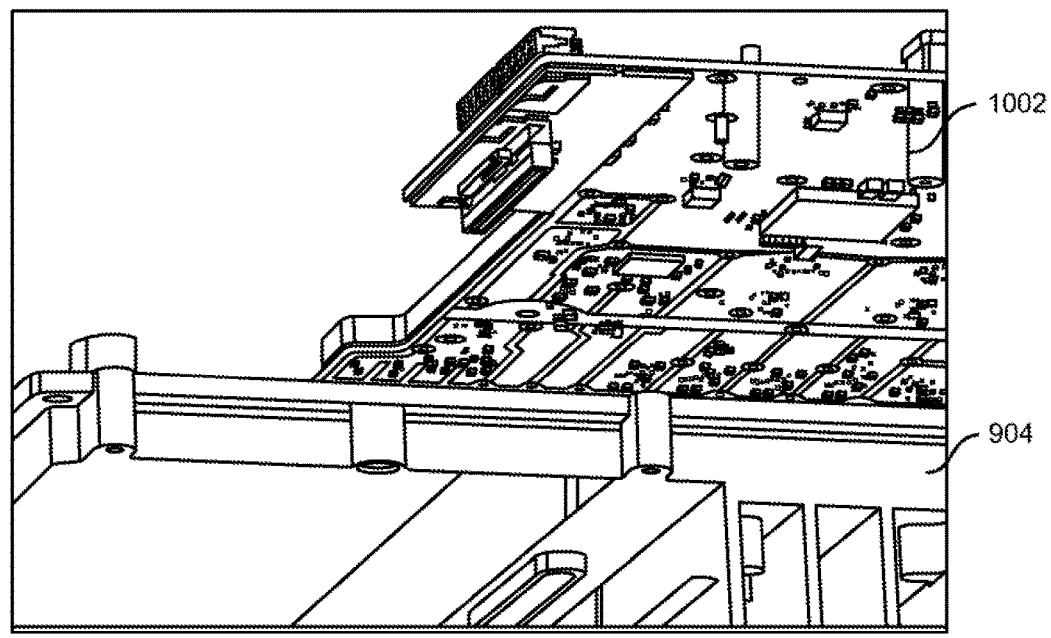

FIGS. 9 and 10a-b illustrate an exemplary exploded view of the radio equipment 900, according to some implementations of the current subject matter. The radio equipment 900 can be similar to the radio equipment shown and described above in connection with FIGS. 7a-d and 8a-c. The radio equipment can include a front end module 902, a radio unit 904, and a signal processing module 906. The variations of the radio equipment 900 can be provided by the signal processing module 906 (e.g., different connections, processing capabilities, signal processing, power, etc.), as discussed above.

In some implementations, the radio unit 904 can include at least one connector 908, which can provide electronic and/or mechanical connection to the signal processing module 906. Various signals can be exchanged between the radio unit and the signal processing module 906 using the connector 908. The connector 908 can be a pin-type connector. The signal processing module 906 can include a corresponding receiving connector (not shown in FIG. 9) that is configured to receive the connector 908 for the purposes of establishing an electronic connection between the radio unit 904 and the signal processing module 906. The connector 908 and the corresponding connector of the signal processing module 906 can be appropriately positioned on the two modules to ensure proper mating of the two connectors. The connectors can provide high-speed communications capabilities. Further, to ensure proper alignment of the radio unit 904 and the signal processing module 906, the radio unit 904 can also include at least one mechanical connector 910 (e.g., a pin, a snap, a lock, etc.) that is configured to protrude away from the surface of the radio unit 904. The mechanical connector 910 can mate with a corresponding connector on the signal processing module 906. The connectors 908 and 910 ensure precise positioning of the signal processing module 906 on the radio unit 904. Such positioning can be configured to prevent coupling and connection errors, which can prevent proper communication between the two modules.

In some implementations, the radio unit 904 can include a radio circuit board processing component 1002, as shown in FIGS. 10a-b. Some of the exemplary electronic components of the radio circuit board processing component 1002 of the radio unit 904 are shown in FIG. 6 as being part of the radio unit 604. The signal processing module 906 can also include various circuit boards containing components similar to those shown in FIG. 6 as being part of the signal processing unit 606.

Figure 11:
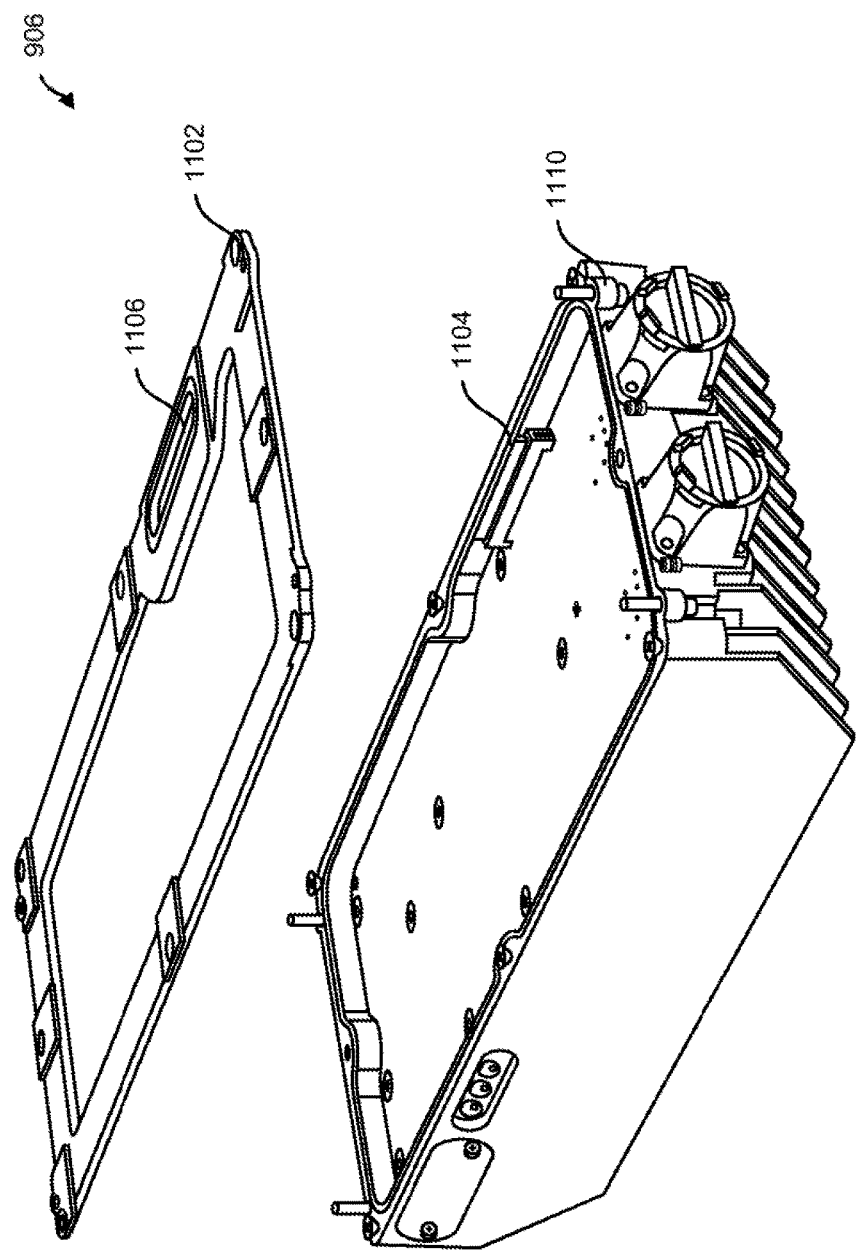
FIG. 11 illustrates an exemplary signal processing module and its connectors, according to some implementations of the current subject matter.
Figure 12B:
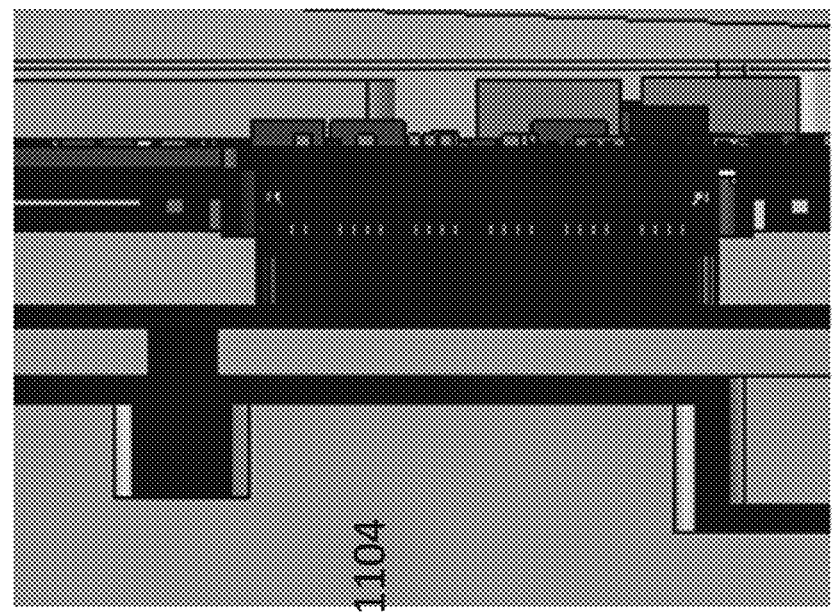
FIGS. 12a-b illustrate exemplary connectors for connecting a signal processing module to the base station, according to some implementations of the current subject matter.
Figure 12A:
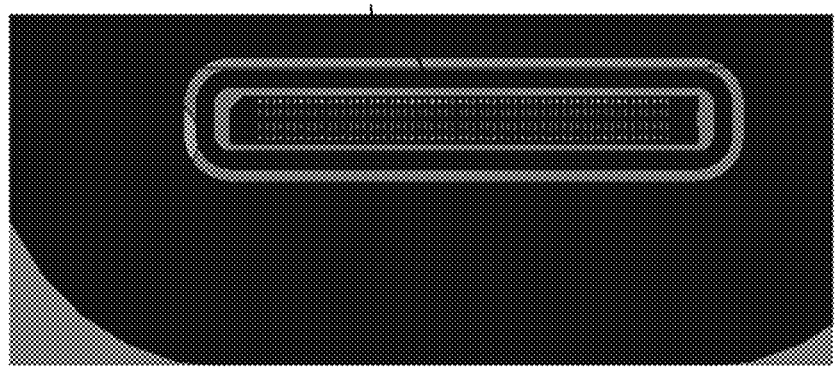

FIGS. 11 and 12a-b illustrate an exemplary signal processing module 906 shown in FIG. 9. The module 906 can include a body 1110 and a cover plate 1102. The body 1110 can include various modules/components (such as those shown in FIG. 6) that can be designed to provide the above-discussed processing capabilities to the radio unit.

The cover plate 1102 can cover the interior portion of the module 906 and can include an opening 1106 for the high speed connector 1104. The male half of the high speed connector (not shown in FIG. 11) can be located on the underside of the radio board of radio unit 904 (shown in FIG. 9 and the corresponding male half of the connector (shown as 1104 in FIG. 11) can be mounted on a circuit board of the signal processing module 906. When the two halves of the connector mate, the connector portions can be aligned in all three-dimensions. This can ensure preciseness of the connection and an ability to provide high-speed transmissions to the equipment involved (as well as versatility to the radio unit in being able to be configured, upgraded, and/or connected in a variety of networks). The removability of the radio unit 904 from the signal processing module 906 can allow for an easy upgrade and/or replacement of either unit.

Figure 13A:
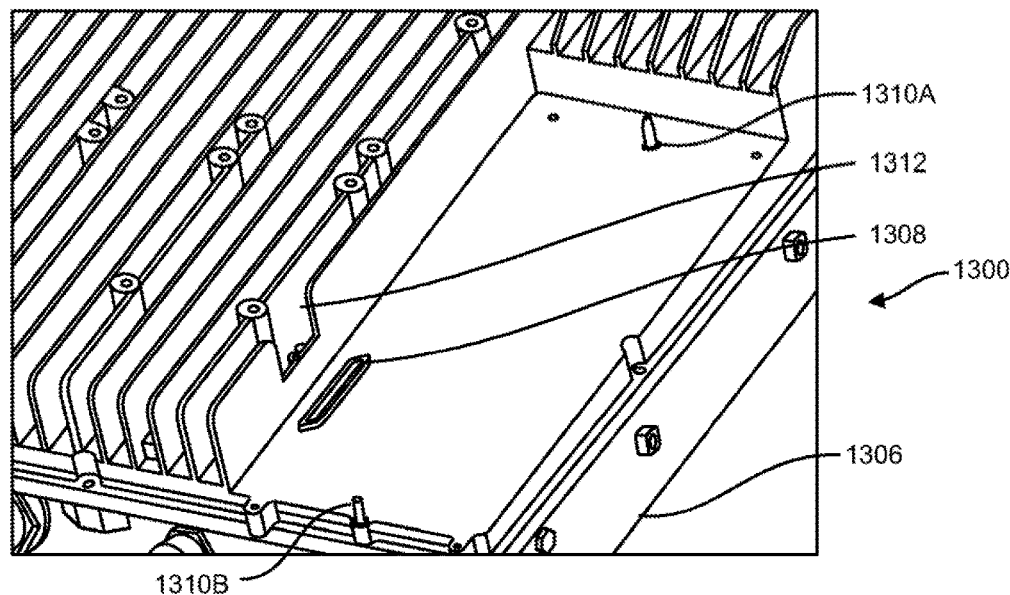
Figure 13B:
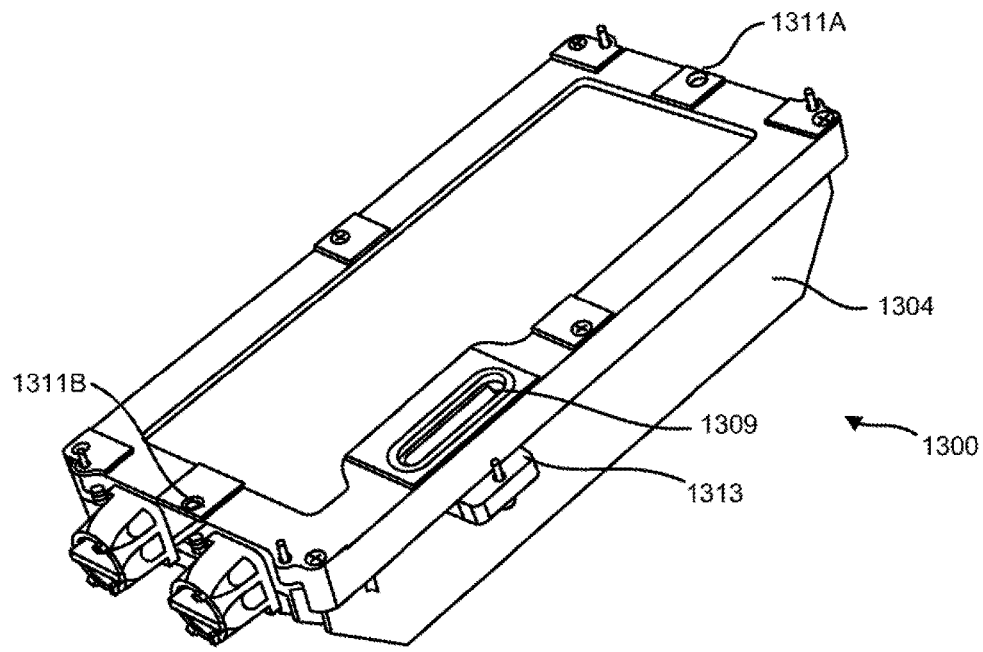

FIGS. 13*a-b* illustrates an exemplary radio equipment 1300 having a radio unit 1304 and a signal processing module 1306. The signal processing module 1306 can include (on a side that is configured to be adjacent to the radio module 1304 once the two modules (unit 1304 and module 1306) are coupled) a high-speed connector 1309, hole connectors 1311 (*a, b*), and a tab connector 1313. The radio unit 1304 can include a high-speed connector 1308, pin connectors 1311 (*a, b*), and a tab-guide 1312. Upon coupling of the radio unit 1304 and the signal processing module 1306, the high-speed connectors 1308 and 1309 are configured to mate to establish a high-speed connection between the radio unit 1304 and the module 1306; the respective pin connectors 1310 and the hole connectors 1311 are also configured to mate; and the tab connector 1313 is configured to mate with the tab guide 1312.

In some implementations, use of the three types of connectors, including the tab guide 1312 and the tab connector 1313 can allow for a precise coupling of the radio unit 1304 and the module 1306. It can also allow for a "blind" mating of the radio unit 1304 and the module 1306, i.e., there is no need to precisely align the two, as the mechanical connectors (i.e., tab guide 1312 and the tab connector 1313, and pin connectors 1310 and hole connectors 1311) will guide the radio unit 1304 into the accurate and proper positioning of the radio unit 1304 into the module 1306, or vice versa.

FIGS. 14*a-c*, 15*a-b*, and 16 illustrate connections of the signal processing module to the radio unit. As shown in FIG. 14*a*, the signal processing module 1402 and the radio unit 1404 can include various tabs that can guide placement of the module 1402 onto the radio unit 1404 (similar to those shown in FIGS. 13*a-b*). The tabs can allow general positioning and/or alignment of the radio unit 1404 with respect to the signal processing module 1402. Further, the radio unit 1404 can include one or more pins 1406 (similar to pin connectors 1310 in FIGS. 13*a-b*) that can be received within corresponding chambers 1408 (or holes, openings, groves, etc. similar to hole connectors 1311 in FIGS. 13*a-b*) located on the signal processing module 1402, as shown in FIG. 14*b*. FIG. 14*c* shows advancement of the pin connector 1406 into the chamber 1408 upon connection of the radio unit 1404 and the signal processing module 1402.

Figure 15A:
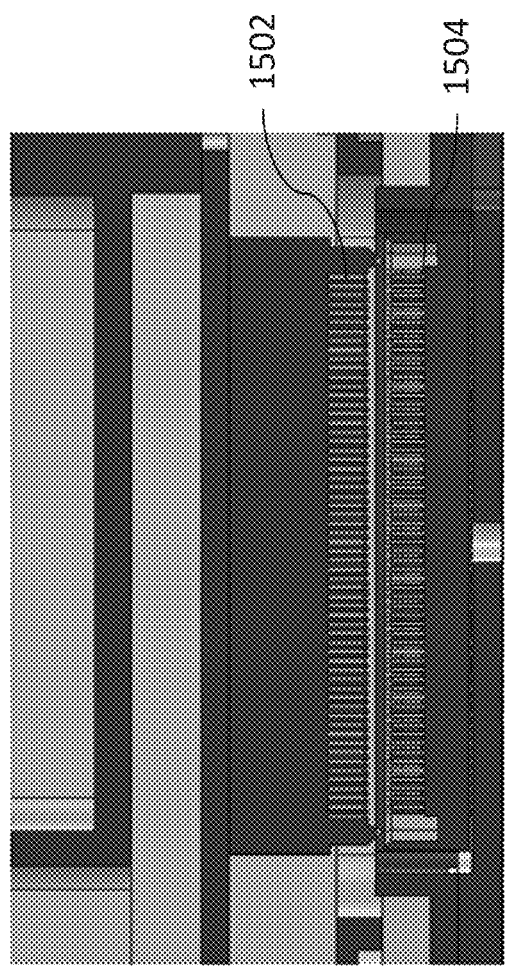
Figure 15B:
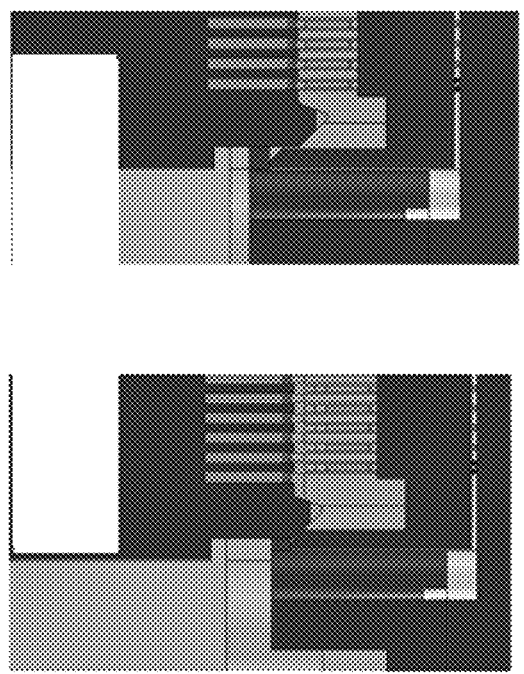
Figure 16:
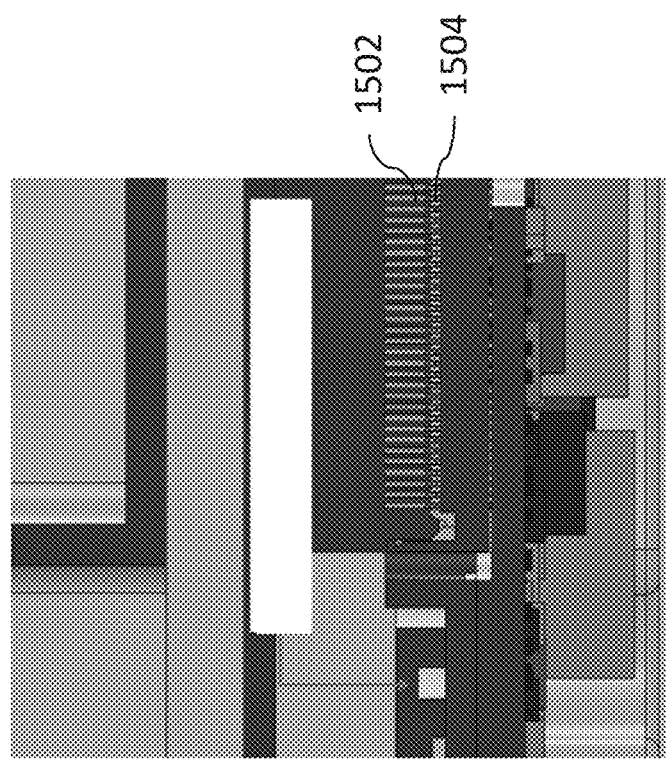

Once the pins 1406 and chambers 1408 are aligned, the high-speed connector can be configured to take over or control further alignment and connection of the radio unit and the signal processing module, as shown in FIGS. 15*a-b*. The pins 1502 and 1504 on the high-speed connector can be configured to mate and ensure that the connection is proper, as shown in FIGS. 15*a-b*. The pins 1502, 1504 can continue guiding the connection until a full connection is achieved. Once the full connection is achieved, a seal (e.g., a radio-environmental seal, an RF seal, etc.) can be accomplished, thereby preventing interference (whether mechanical, electrical, RF, and/or any other type of interference) with the connection formed between the signal processing module and the radio unit, as shown in FIG. 16. In some implementation, a separate seal can be included surrounding the high-speed connector on the radio unit and the signal processing module. The seal can prevent entry of dirt, moisture, and/or other elements that can interfere with operation of the radio equipment. The seal can be manufactured from any material, such as rubber, plastic, metal, etc. It can be glued, welded, mechanically coupled, and/or attached in any desired way.

Figure 17:
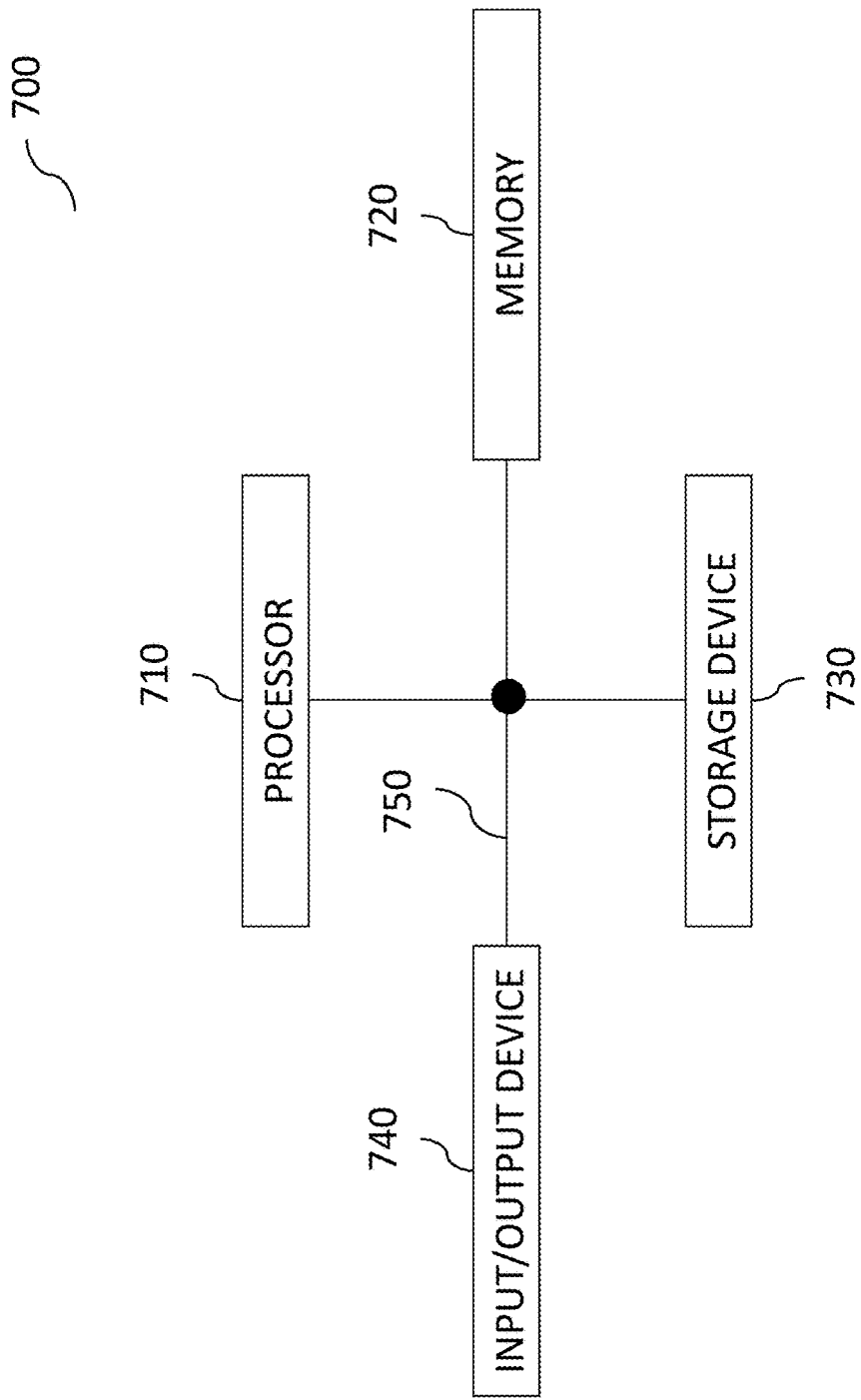
FIG. 17 illustrates an exemplary system, according to some implementations of the current subject matter.

In some implementations, the current subject matter can be configured to be implemented in a system 1700, as shown in FIG. 17. The system 1700 can include one or more of a processor 1710, a memory 1720, a storage device 1730, and an input/output device 1740. Each of the components 1710, 1720, 1730 and 1740 can be interconnected using a system bus 1750. The processor 1710 can be configured to process instructions for execution within the system 400. In some implementations, the processor 1710 can be a single-threaded processor. In alternate implementations, the processor 1710 can be a multi-threaded processor. The processor 1710 can be further configured to process instructions stored in the memory 1720 or on the storage device 1730, including receiving or sending information through the input/output device 1740. The memory 1720 can store information within the system 1700. In some implementations, the memory 1720 can be a computer-readable medium. In alternate implementations, the memory 1720 can be a volatile memory unit. In yet some implementations, the memory 1720 can be a non-volatile memory unit. The storage device 1730 can be capable of providing mass storage for the system 1700. In some implementations, the storage device 1730 can be a computer-readable medium. In alternate implementations, the storage device 1730 can be a floppy disk device, a hard disk device, an optical disk device, a tape device, non-volatile solid-state memory, or any other type of storage device. The input/output device 1740 can be configured to provide input/output operations for the system 1700. In some implementations, the input/output device 1740 can include a keyboard and/or pointing device. In alternate implementations, the input/output device 1740 can include a display unit for displaying graphical user interfaces.

Figure 18:
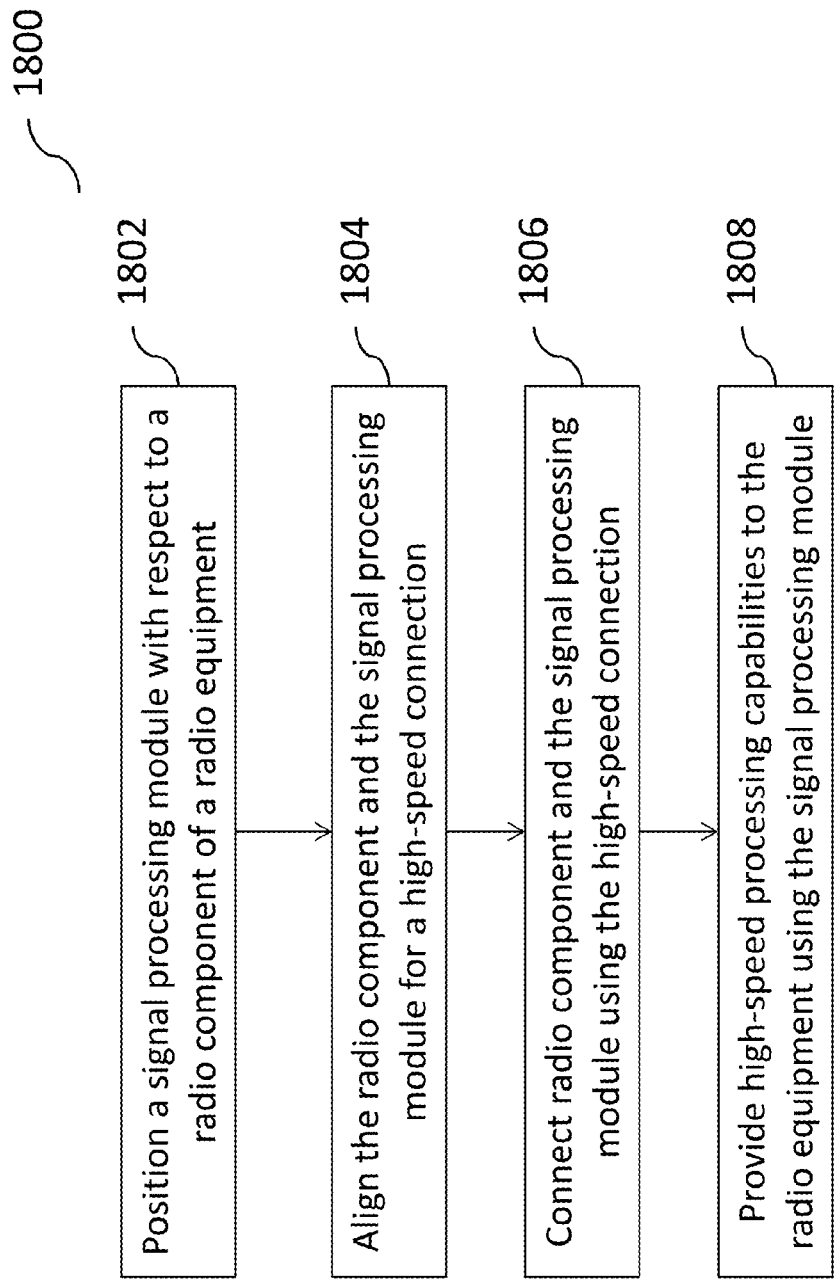
FIG. 18 illustrates an exemplary method, according to some implementations of the current subject matter.

FIG. 18 illustrates an exemplary method 1800 for interconnecting components in a radio equipment (e.g., radio equipment as shown and described above in connection with FIGS. 1-16), according to some implementations of the current subject matter. At 1802, positioning a signal processing module (e.g., signal processing module 704 as shown in FIG. 7) with respect to a radio component of a radio equipment (e.g., radio unit 702 as shown in FIG. 7). At 1804, using at least one first mechanical connection, comprising a first part and a second part (e.g., male and female parts of the mechanical connector (e.g., pins 715, 717 shown in FIG. 7 as well as pin 1406 and chamber 1408 shown in FIGS. 14*a-c*), the first part of the first mechanical connection being disposed on the radio component and the second part of the first mechanical connection being disposed on the signal processing module, aligning the radio component and the signal processing module for a high-speed connection. At 1806, using a high-speed connection, comprising a first part and a second part, the first part of the high-speed connection being disposed on the radio component and the second part of the high-speed connection being disposed on the signal processing module, connecting radio component and the signal processing module using and/or through the high-speed connection. At 1808, providing high-speed processing capabilities to the radio equipment using the signal processing module, the signal processing module being interchangeably connected to the radio equipment.

In some implementations, the current subject matter can include one or more of the following optional features. In some implementations, the radio equipment can include at least one of the following: an evolved node (eNodeB) base station, a baseband unit, a remote radio head, a base station, a micro base station, a macro base station, an omni-directional base station, a directional base station, and any combination thereof.

In some implementations, the aligning can include guiding the radio component for a mechanical connection with the signal processing module. The guiding can be performed using at least one guiding connector having a first part and a second part. The first part of the guiding connector can be disposed on the radio component and the second part of the guiding connector can be disposed on the signal processing module. The guiding connector can prevent misalignment of the radio component and the signal processing module.

In some implementations, the first part of the first mechanical connector can be a female part and the second part of the first mechanical connector can be a male part. The first and second parts can be configured to mate to form a mechanical connection prior to establishing the high-speed connection.

In some implementations, the connecting can include providing, by the at least one high-speed connector, a sealed high-speed connection between the radio component and the signal processing module. The sealed high-speed connection can be formed subsequent to the mechanical connections formed by the guiding connector and the first mechanical connector.

In some implementations, the sealed high-speed connection can be formed using at least one seal. The seal can include at least one of the following: a radio-environmental seal, a radio frequency seal, and any combination thereof.

In some implementations, the guiding connector and the first mechanical connector can control alignment of the radio component with respect to the signal processing module during connection of the radio component and the signal processing module.

The systems and methods disclosed herein can be embodied in various forms including, for example, a data processor, such as a computer that also includes a database, digital electronic circuitry, firmware, software, or in combinations of them. Moreover, the above-noted features and other aspects and principles of the present disclosed implementations can be implemented in various environments. Such environments and related applications can be specially constructed for performing the various processes and operations according to the disclosed implementations or they can include a general-purpose computer or computing platform selectively activated or reconfigured by code to provide the necessary functionality. The processes disclosed herein are not inherently related to any particular computer, network, architecture, environment, or other apparatus, and can be implemented by a suitable combination of hardware, software, and/or firmware. For example, various general-purpose machines can be used with programs written in accordance with teachings of the disclosed implementations, or it can be more convenient to construct a specialized apparatus or system to perform the required methods and techniques.

The systems and methods disclosed herein can be implemented as a computer program product, i.e., a computer program tangibly embodied in an information carrier, e.g., in a machine readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

As used herein, the term "user" can refer to any entity including a person or a computer.

Although ordinal numbers such as first, second, and the like can, in some situations, relate to an order; as used in this document ordinal numbers do not necessarily imply an order. For example, ordinal numbers can be merely used to distinguish one item from another. For example, to distinguish a first event from a second event, but need not imply any chronological ordering or a fixed reference system (such that a first event in one paragraph of the description can be different from a first event in another paragraph of the description).

The foregoing description is intended to illustrate but not to limit the scope of the invention, which is defined by the scope of the appended claims. Other implementations are within the scope of the following claims.

These computer programs, which can also be referred to programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, the subject matter described herein can be implemented on a computer having a display device, such as for example a cathode ray tube (CRT) or a liquid crystal display (LCD) monitor for displaying information to the user and a keyboard and a pointing device, such as for example a mouse or a trackball, by which the user can provide input to the computer. Other kinds of devices can be used to provide for interaction with a user as well. For example, feedback provided to the user can be any form of sensory feedback, such as for example visual feedback, auditory feedback, or tactile feedback; and input from the user can be received in any form, including, but not limited to, acoustic, speech, or tactile input.

The subject matter described herein can be implemented in a computing system that includes a back-end component, such as for example one or more data servers, or that includes a middleware component, such as for example one or more application servers, or that includes a front-end component, such as for example one or more client computers having a graphical user interface or a Web browser through which a user can interact with an implementation of the subject matter described herein, or any combination of such back-end, middleware, or front-end components. The components of the system can be interconnected by any form or medium of digital data communication, such as for example a communication network. Examples of communication networks include, but are not limited to, a local area network ("LAN"), a wide area network ("WAN"), and the Internet.

The computing system can include clients and servers. A client and server are generally, but not exclusively, remote from each other and typically interact through a communication network. The relationship of client and server arises by virtue of computer programs running on the respective computers and having a client-server relationship to each other.

The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations can be within the scope of the following claims.

What is claimed:

1. A method for interconnecting components in a radio equipment, comprising:

positioning a signal processing module with respect to a radio component of the radio equipment;

aligning, using at least one first mechanical connector having a first part and a second part, the first part of the at least one first mechanical connector being disposed on the radio component and the second part of the at least one first mechanical connector being disposed on the signal processing module, the radio component and the signal processing module for a high-speed connection, wherein the aligning includes guiding, using at least one guiding connector having a first part and a second part, the first part of the at least one guiding connector being disposed on the radio component and the second part of the at least one guiding connector being disposed on the signal processing module, the radio component for a mechanical connection with the signal processing module, the at least one guiding connector preventing misalignment of the radio component and the signal processing module, wherein the first part of the at least one first mechanical connector is a female part and the second part of the at least one first mechanical connector is a male part, the first and second parts are configured to mate to form a mechanical connection prior to establishing the high-speed connection;

connecting, using at least one high-speed connector having a first part and a second part, the first part of the high-speed connector being disposed on the radio component and the second part of the at least one high-speed connector being disposed on the signal processing module, the radio component and the signal processing module using the at least one high-speed connector, wherein the connecting includes providing, by the at least one high-speed connector, a sealed high-speed connection between the radio component and the signal processing module, the sealed high-speed connection is formed subsequent to the mechanical connections formed by the at least one guiding connector and the at least one first mechanical connector; and providing at least one high-speed processing capability to the radio equipment using the signal processing module through the at least one high-speed connector, wherein the signal processing module being interchangeably connected to the radio equipment.

2. The method according to claim 1, wherein the radio equipment includes at least one of the following: an evolved node (eNodeB) base station, a baseband unit, a remote radio head, a base station, a micro base station, a macro base station, an omni-directional base station, a directional base station, and any combination thereof.

3. The method according to claim 1, wherein the sealed high-speed connection is formed using at least one seal, the at least one seal including at least one of the following: a radio-environmental seal, a radio frequency seal, and any combination thereof.

4. The method according to claim 1, wherein the at least one guiding connector and the at least one first mechanical connector control alignment of the radio component with respect to the signal processing module during connection of the radio component and the signal processing module.

5. A radio equipment including interconnected components, comprising:

a radio component;

a signal processing module, the signal processing module being positioned with respect to the radio component of the radio equipment;

at least one first mechanical connector having a first part and a second part, wherein the first part of the at least one first mechanical connector being disposed on the radio component and the second part of the at least one first mechanical connector being disposed on the signal processing module, the radio component and the signal processing module are aligned using the at least one first mechanical connection for a high-speed connection, wherein the alignment of the radio component and the signal processing module includes guiding, using at least one guiding connector having a first part and a second part, the first part of the at least one guiding connector being disposed on the radio component and the second part of the at least one guiding connector being disposed on the signal processing module, the radio component for a mechanical connection with the signal processing module, the at least one guiding connector preventing misalignment of the radio component and the signal processing module, wherein the first part of the at least one first mechanical connector is a female part and the second part of the at least one first mechanical connector is a male part, the first and second parts are configured to mate to form a mechanical connection prior to establishing the high-speed connection; and, at least one high-speed connector having a first part and a second part, wherein the first part of the high-speed connector being disposed on the radio component and the second part of the at least one high-speed connector being disposed on the signal processing module, the radio component and the signal processing module are connected using the at least one high-speed connector, wherein the connection of the radio component and the at least one processing module includes providing, by the at least one high-speed connector, a sealed high-speed connection between the radio component and the signal processing module, the sealed high-speed connection is formed subsequent to the mechanical connections formed by the at least one guiding connector and the at least one first mechanical connector; and wherein at least one high-speed processing capability is provided to the radio equipment using the signal processing module and through the high-speed connector, wherein the signal processing module being interchangeably connected to the radio equipment.

6. The radio equipment according to claim 5, wherein the radio equipment includes at least one of the following: an evolved node (eNodeB) base station, a baseband unit, a remote radio head, a base station, a micro base station, a macro base station, an omni-directional base station, a directional base station, and any combination thereof.

7. The radio equipment according to claim 5, wherein the sealed high-speed connection is formed using at least one seal, the at least one seal including at least one of the following: a radio-environmental seal, a radio frequency seal, and any combination thereof.

8. The radio equipment according to claim 5, wherein the at least one guiding connector and the at least one first mechanical connector control alignment of the radio component with respect to the signal processing module during connection of the radio component and the signal processing module.

* * * * *